(12) United States Patent
Yeo

(10) Patent No.: US 8,040,679 B2
(45) Date of Patent: Oct. 18, 2011

(54) PLASMA DISPLAY APPARATUS HAVING SEGMENTED CHASSIS BASE

(75) Inventor: Jae-Young Yeo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 504 days.

(21) Appl. No.: 12/184,034

(22) Filed: Jul. 31, 2008

(65) Prior Publication Data

US 2009/0072738 A1     Mar. 19, 2009

(30) Foreign Application Priority Data

Sep. 6, 2007    (KR) .................. 10-2007-0090591

(51) Int. Cl.
*G06F 1/16*      (2006.01)
*H05K 5/00*      (2006.01)
*H05K 7/00*      (2006.01)

(52) U.S. Cl. ........ 361/759; 361/752; 361/758; 361/818; 313/586

(58) Field of Classification Search .......... 361/600, 361/679.4, 681, 753, 679.01, 679.02, 679.21, 361/679.22, 679.26, 816–818, 707, 704, 361/752, 759; 313/582–587; 349/58–60; 348/836, E3.14, 748, 304.4; 359/885, 890, 359/892, 585; 345/41

See application file for complete search history.

(56) References Cited

U.S. PATENT DOCUMENTS

| | | | |
|---|---|---|---|
| 2005/0067963 A1* | 3/2005 | Kim et al. ................ | 313/583 |
| 2005/0212426 A1* | 9/2005 | Ahn ......................... | 313/582 |
| 2006/0061945 A1 | 3/2006 | Kim | |
| 2006/0290596 A1* | 12/2006 | Kweon et al. ............ | 345/60 |
| 2007/0004253 A1 | 1/2007 | Lee et al. | |
| 2007/0086149 A1 | 4/2007 | Choi | |
| 2007/0228952 A1* | 10/2007 | Kwon et al. ............. | 313/580 |
| 2008/0211406 A1* | 9/2008 | Watanabe et al. ........ | 313/582 |
| 2009/0000169 A1* | 1/2009 | Houssain et al. ........ | 40/605 |

FOREIGN PATENT DOCUMENTS

| | | | |
|---|---|---|---|
| JP | 11233967 A | * | 8/1999 |
| KR | 2005024040 A | * | 3/2005 |
| KR | 10-2005-0050450 | | 5/2005 |
| KR | 10-2005-0100964 | | 10/2005 |
| KR | 10-2006-0061582 | | 6/2006 |
| KR | 10-2007-0042285 | | 4/2007 |

OTHER PUBLICATIONS

Machine translation of KR 2005024040 A.*
Korean Registration Determination Certificate dated Sep. 30, 2008, for corresponding Korean application 10-2007-0090591, noting listed references in this IDS.
Extended European Search Report dated Jun. 7, 2011 in corresponding European Patent Application No. 08163351, listing the cited references in this IDS, 4 pages.

* cited by examiner

*Primary Examiner* — Nimeshkumar Patel
*Assistant Examiner* — Jose M Diaz
(74) *Attorney, Agent, or Firm* — Christie, Parker & Hale, LLP

(57) ABSTRACT

A display apparatus includes a display panel and a chassis base for supporting the display panel. The chassis base has a plurality of metallic plates on a common plane and an electrically insulating connector between edges of a pair of adjacent metallic plates.

11 Claims, 8 Drawing Sheets

PLASMA DISPLAY APPARATUS HAVING SEGMENTED CHASSIS BASE

CROSS-REFERENCE TO RELATED APPLICATION

This application claims priority to and the benefit of Korean Patent Application No. 10-2007-0090591, filed on Sep. 6, 2007, in the Korean Intellectual Property Office, the entire disclosure of which is incorporated herein by reference.

BACKGROUND

1. Field of the Invention

The present invention relates to a plasma display apparatus, and more particularly, to a chassis base for a plasma display panel (PDP).

2. Description of the Related Art

Plasma display apparatuses are relatively flat display apparatuses that generally form an image via light emitted from ultraviolet rays generated by a discharge gas injected between facing substrates when a voltage is applied to electrodes placed on opposite sides of the substrates. The plasma display apparatuses may be manufactured to have a thickness of less than several centimeters, a relatively large screen, and a wide viewing angle compared to other displays. Accordingly, plasma display apparatuses have been spotlighted as the next generation of display apparatuses.

A conventional plasma display apparatus may include a PDP for displaying an image using plasma generated by a gas discharge, a chassis base for supporting the PDP, and circuit board assemblies for supplying signals to electrodes of the PDP. The circuit board assemblies may be mounted on a side surface of the chassis base, opposite a side surface where the PDP is mounted.

The chassis base may comprise a metallic material such as aluminum having a high mechanical rigidity, and may be on a rear surface of the PDP to allow attachment of the circuit board assemblies and to reinforce the PDP. The chassis base may also serve as a heat sink for dissipating heat generated in the PDP and the circuit board assemblies and as an electromagnetic radiation ground to reduce electromagnetic interference (EMI).

The PDP is driven by electrical signals with high frequencies and high voltages, and thus generates a strong EMI. The PDP and the circuit board assemblies usually generate noise in a low bandwidth (between about 30-200 MHz), while the operational performance of the PDP may be affected by noise with a frequency of about 100 MHz. The electromagnetic interference generated by the PDP may affect viewers and electronic devices in the vicinity of the PDP.

The chassis base provides the largest ground area in the plasma display apparatus. Therefore, when EMI generated by driving the PDP reaches the chassis base, the chassis base may operate as an antenna that further transmits the EMI.

SUMMARY

Aspects of the present invention provide a plasma display apparatus having a chassis base that does not act as an antenna for transmitting EMI generated during operation of the plasma display panel.

In one embodiment, a display apparatus includes a display panel and a chassis base for supporting the display panel. The chassis base has a plurality of metallic plates on a common plane and an electrically insulating connector between edges of a pair of adjacent metallic plates.

In one embodiment, a width and a length of each of the plurality of metallic plates is less than ¼ of a wavelength $\lambda$ of a bandwidth of a maximum electromagnetic field in the display apparatus. The electrically insulating connector may include a first side and a second side opposite the first side both having a recess adapted to receive a metallic plate, wherein an edge of one metallic plate is in the recess on the first side and an edge of another metallic plate is in the recess on the second side. Further, each of the plurality of metallic plates may include a rib extending along at least one edge, the rib being within the recess of one of the first side and the second side of one electrically insulating connector.

In another embodiment, at least one edge of each of the plurality of metallic plates has a recess adapted to receive a side of one electrically insulating connector, one side of one electrically insulating connector being inserted into the recess. In a further embodiment, the electrically insulating connector may include a first connector attached to an edge of one of the plurality of metallic plates and a second connector adapted to receive the first connector and attached to an edge of another of the plurality of metallic plates, the second connector connected to the first connector. The first connector may include a recess, and the second connector may include a protrusion adapted to fit within the recess such that when the protrusion is within the recess, the first connector is connected to the second connector. The first connector and the second connector may be attached to the first metallic plate and the second metallic plate, respectively, by bolts or other suitable fasteners. Further, each of the first connector and the second connector may have a recess adapted to receive an edge of one of the plurality of metallic plates, wherein an edge of one metallic plate is within the recess on the first connector and an edge of another metallic plate is within the recess on the second connector.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
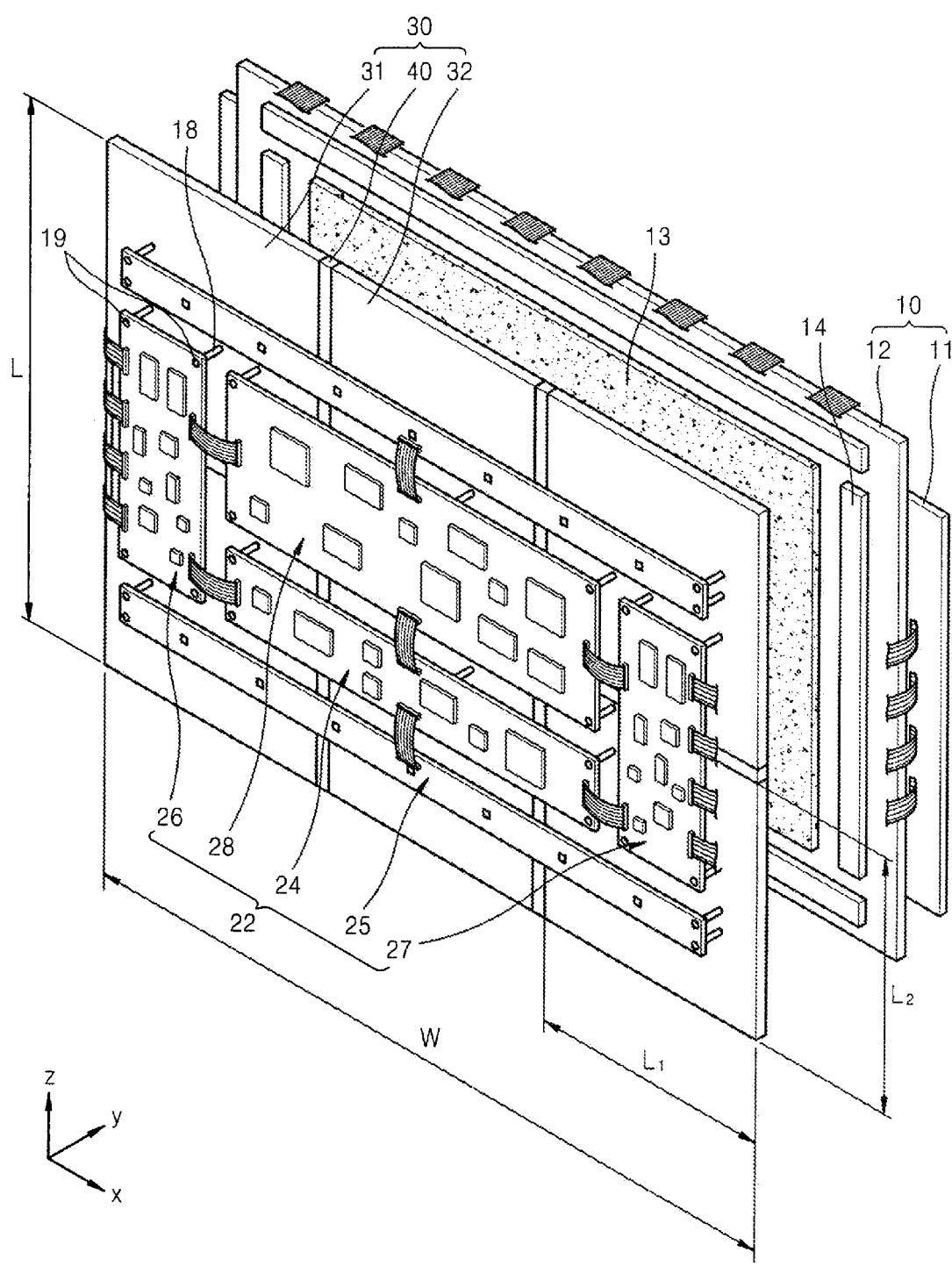
FIG. 1 is an exploded perspective view of a plasma display apparatus according to an embodiment of the present invention.

In the following detailed description, only certain exemplary embodiments of the present invention are shown and described, by way of illustration. As those skilled in the art will recognize, the invention may be embodied in many different forms and should not be construed as being limited to the embodiments set forth herein. Like reference numerals designate like elements throughout the specification.

With reference to FIG. 1, the plasma display apparatus includes a PDP 10 for displaying an image via a gas discharge, and a chassis base 30 attached to a rear side of the PDP 10, the chassis base including circuit board assemblies 22 for driving the PDP 10 attached thereto.

The PDP 10 includes a front substrate 11 facing a rear substrate 12. A plurality of discharge spaces defined by barrier ribs are located between the front substrate 11 and the rear substrate 12, and address electrodes and display electrodes (pairs of sustain electrodes and scan electrodes) cross one another in the discharge spaces. When driving signals are applied between the address electrodes and the display electrodes, a gas discharge occurs in the discharge spaces and visible rays are emitted by the gas discharge in a direction toward the front substrate 11 from the discharge spaces so that an image is displayed on the PDP 10.

The chassis base 30 is mounted behind the rear substrate 12 of the PDP 10 and is composed of a material having a high mechanical rigidity for supporting the PDP 10 and the circuit board assembly 22.

A heat-dissipating sheet 13 and double-sided tape 14 are located between the rear side of the PDP 10 and the front side of the chassis base 30. The heat-dissipating sheet 13 conducts and disperses heat generated by the PDP 10 due to gas discharge in an x-z plane direction. The heat-dissipating sheet 13 may be composed of, for example, an acryl-based heat-dissipating material having high thermal conductivity, a graphite-based heat-dissipating material, a metal-based heat-dissipating material, or carbon nanotube-based heat-dissipating material.

The double-sided tape 14 is used to attach the PDP 10 to the chassis base 30. The heat-dissipating sheet 13 may also be attached between the rear side of the PDP 10 and the front side of the chassis base 30.

The circuit board assemblies 22 are mounted on a boss 18 of the chassis base 30 using a set screw 19. The circuit board assemblies 22 may include an image processing/control board assembly 24, an address buffer board assembly 25, a scan driving board assembly 26, a sustain driving board assembly 27, and a switching mode power supply (SMPS) board assembly 28.

The image processing/control board assembly 24 receives an external image signal to generate a control signal for driving address electrodes, scan electrodes, or sustain electrodes. The control signal is applied to the address buffer board assembly 25, the scan driving board assembly 26, or the sustain driving board assembly 27. The address buffer board assembly 25 generates an address pulse signal that is applied to the address electrodes of the PDP 10. The scan driving board assembly 26 generates a scan pulse signal that is applied to the scan addresses of the PDP 10. The sustain driving board assembly 27 generates a sustain pulse signal that is applied to the sustain electrodes of the PDP 10. The SMPS board assembly 28 supplies power for driving the PDP 10.

Figure 2:
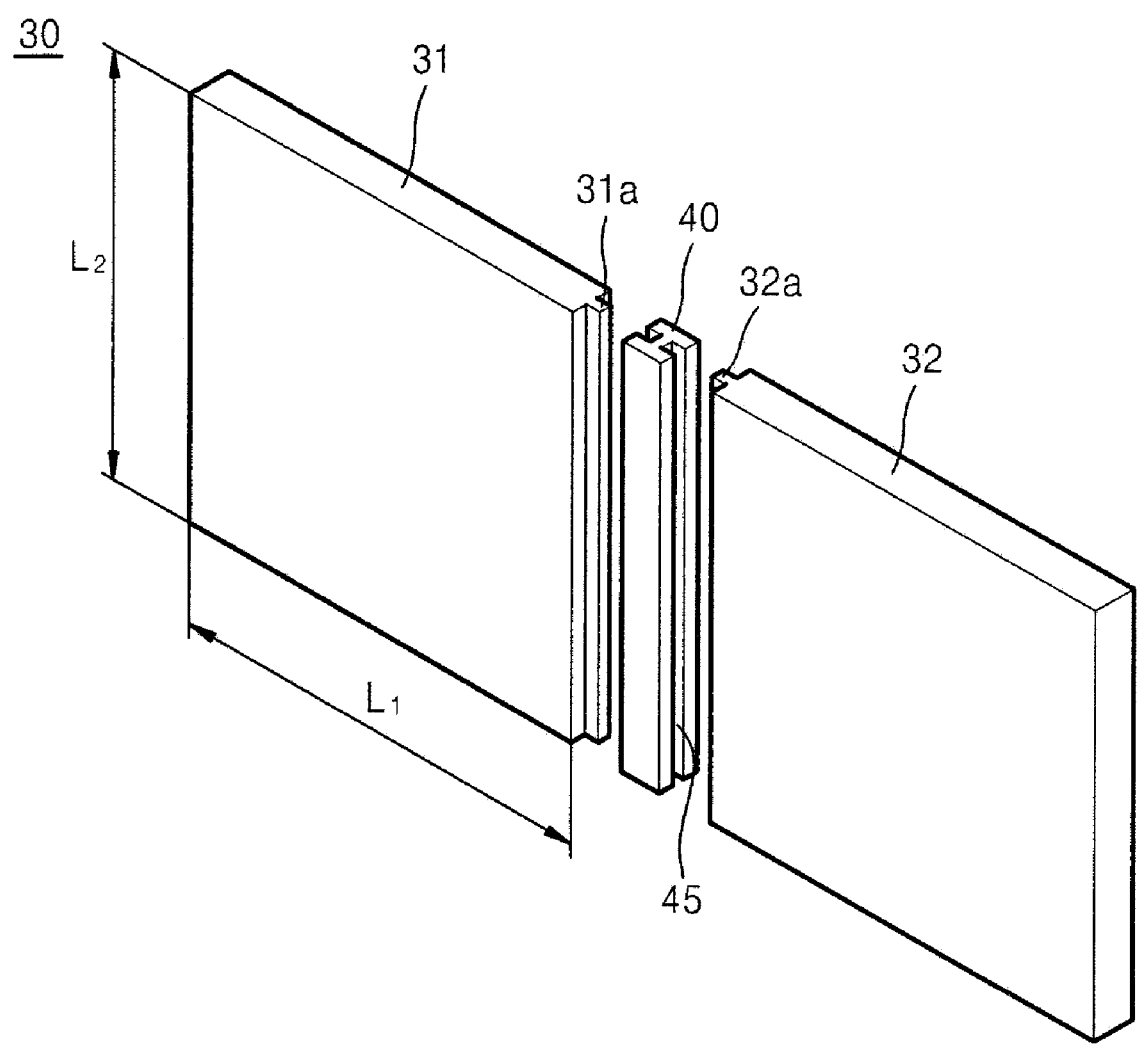
FIG. 2 is an exploded perspective view of metallic plates and a connector of a chassis base of the plasma display apparatus of FIG. 1.

With reference now to FIG. 2, the chassis base 30 includes a plurality of metallic plates 31, 32 on a common plane on a rear surface of the PDP 10 between the rear substrate 12 and the circuit board assemblies 22. The metallic plates 31, 32 may be connected by an electrically insulating connector 40. More specifically, edges of the metallic plates 31, 32 are inserted into the connector to allow the metallic plates to be connected by the connector 40.

As illustrated in FIG. 2, recesses 45 are formed along sides of the connector 40 that face the metallic plates 31, 32. Edges of the metallic plates 31, 32 are inserted into the recesses 45 of the connector 40 so that the adjacent metallic plates 31, 32 are connected to each other. More specifically, the metallic plates 31, 32 may include protrusions or rails 31a, 32a that are inserted in the recesses 45 so that the metallic plates 31, 32 and the connector 40 can be combined.

As illustrated in FIGS. 1 and 2, due to the plurality of metallic plates 31, 32 connected by electrically insulating connectors 40, an electromagnetic field generated in the PDP 10 and transmitted by the chassis base 30 can be minimized. In one embodiment, a width $L_1$ and a length $L_2$ of the metallic plates 31, 32 are less than ¼ of a wavelength λ of a bandwidth of a maximum electromagnetic field generated in the PDP 10.

It is known that an antenna has maximum efficiency when the length of the antenna is ¼ of a wavelength λ of a bandwidth in which an electromagnetic field is generated. Generally, since the length of a chassis base is larger than ¼ of a wavelength λ of a bandwidth in which an electromagnetic field is generated, the chassis base functions as an antenna and the plasma display apparatus is highly sensitive to EMI in a low bandwidth. However, in the present embodiment, since the chassis base 30 includes the plurality of the metallic plates 31, 32 having the width $L_1$ and the length $L_2$ less than a ¼ of a wavelength λ of a bandwidth in which an electromagnetic field is generated, the chassis base 30 does not function as an antenna, and thus the EMI can be reduced.

Upon measuring the intensity of sustain noise generated when the sustain driving board assembly 27 supplies a sustain pulse signal, the maximum electromagnetic field generated in the PDP 10 is generally at a frequency of 80 MHz. When the frequency of a bandwidth where the electromagnetic field is maximum is f(Hz) and the wavelength of the electromagnetic field is λ(m), the speed v(m/s) of the electromagnetic field is obtained according to equation 1.

$$v = f \times \lambda \quad (1)$$

In addition, when light velocity is C(m/s), the permittivity of a medium is ϵ, and the permeability of the medium is μ, the speed v of EMI is obtained by equation 2.

$$v = \frac{C}{\sqrt{\epsilon\mu}} \quad (2)$$

Accordingly, by combining equations (1) and (2), the wavelength λ(m) at which the electromagnetic field is maximum, is given by equation 3.

$$\lambda = \frac{C}{f\sqrt{\epsilon\mu}} \quad (3)$$

When light velocity $C=3\times10^8$ m/s, $\epsilon\mu=4$, and f=80 MHz are substituted in equation (3), the wavelength $\lambda$(m) is obtained by equation 4.

$$\lambda = \frac{(3\times10^8)}{(80\times10^6)\sqrt{4}} = 1.875 \text{ (m)} \tag{4}$$

$$\frac{\lambda}{4} = 468.75 \text{ (mm)} \tag{5}$$

Therefore, in one embodiment, the width $L_1$ and the length $L_2$ of the metallic plates 31, 32 should be equal to or less than 468.75 mm (1.875 m/4).

If the total width W and the total length L of the chassis base 30 are respectively 1,155 mm and 671 mm, the width $L_1$ of the metallic plates 31, 32 is about 385 mm, a value that is obtained by dividing the entire width W by three parts, and the length $L_2$ of the metallic plates 31, 32 is about 335.5 mm, a value that is obtained by dividing the entire length L by two. Thus, when there are six metallic plates arranged as illustrated in FIG. 1, and the width $L_1$ and the length $L_2$ of each of the metallic plates 31, 32 are less than ¼ of a wavelength $\lambda$ of a bandwidth of a maximum electromagnetic field.

In many conventional plasma display apparatuses, a single plate, usually corresponding to a size of a PDP, is used as the chassis base. Thus, the chassis base functions as an antenna and a strong electromagnetic field is generated in the PDP.

In embodiments of the present invention, however, the metallic plates 31, 32 of the chassis base 30 illustrated in FIG. 1 are separated and insulated from each other by the connector 40. Thus, due to the configuration of the metallic plates 31, 32, the electromagnetic field generated by the PDP 10 is divided in half in the vertical direction and into thirds in the horizontal direction. Additionally, since the metallic plates 31, 32 do not function as an antenna for transmitting the electromagnetic field, the EMI may be significantly reduced.

Figure 3:
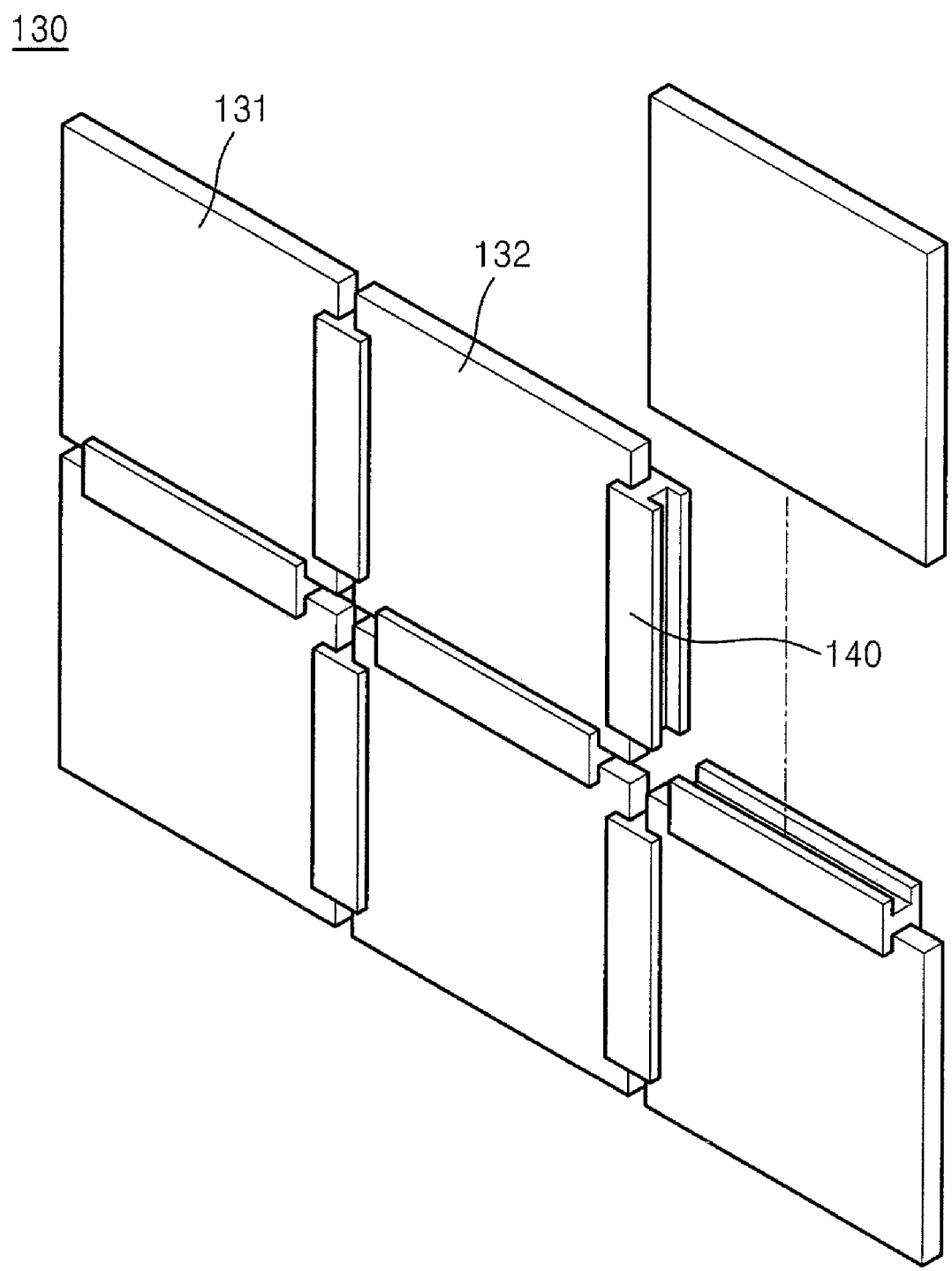
FIG. 3 is a partially exploded perspective view of metallic plates and connectors of a chassis base of a plasma display apparatus according to another embodiment of the present invention.

With reference now to FIG. 3, a chassis base 130 includes a plurality of metallic plates 131, 132 on a common plane on a rear surface of the PDP 10 between the rear substrate 12 and the circuit board assemblies 22, similarly to the metallic plates shown in FIG. 2. An electrically insulating connector 140 connects edges of the metallic plates 131, 132.

Recesses 145 extend along sides of the connector 140 facing the metallic plates 131, 132, and the edges of the metallic plates 131, 132 are directly inserted into the recesses 145 to connect adjacent metallic plates. In the present embodiment, widths of the recesses 145 generally correspond to a thickness of the metallic plates 131, 132.

Figure 4:
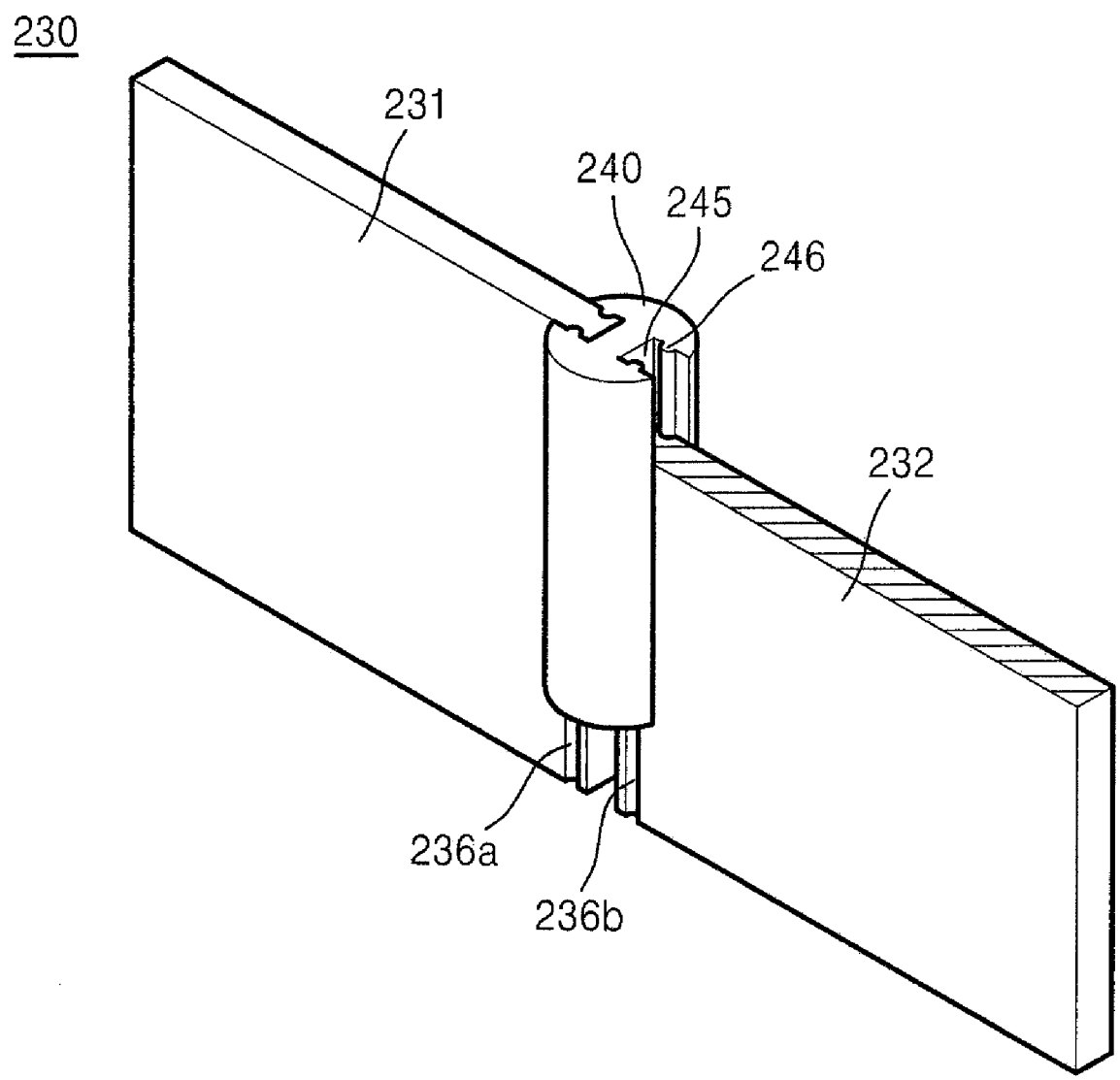
FIG. 4 is a perspective view of metallic plates and a connector of a chassis base of a plasma display apparatus according to yet another embodiment of the present invention.

With reference now to FIG. 4, a plurality of metallic plates 231, 232 similar to the previously described metallic plates are shown connected by an electrically insulating connector 240 to form a chassis base 230. Recesses 245 extend along sides of the connector 240 facing the metallic plates 231, 232, and protrusions 246 extend along an interior of the recesses 245. Edges of the metallic plates 231, 232 are inserted in the recesses 245 of the connector 240. Side surfaces of the plates proximate the edges have grooves 236a, 236b shaped corresponding to a shape of the protrusions 246 such that when the edges of the metallic plates 231, 232 are combined with the recesses 245, the grooves 236a, 236b engage the protrusions 246 to securely attach the metallic plates 231, 232 and the connector 240.

Figure 5:
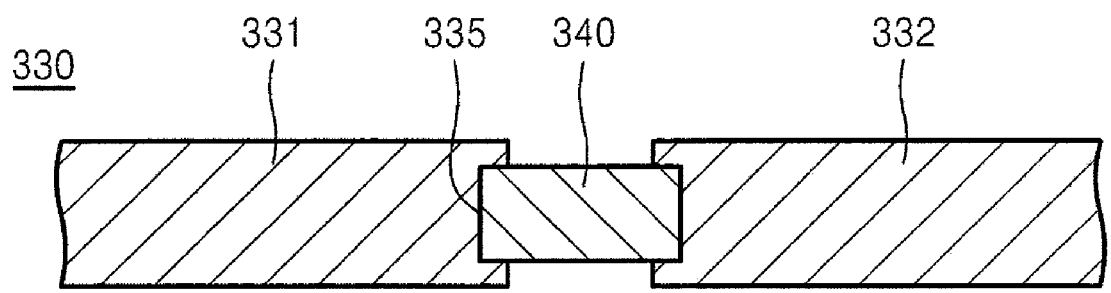
FIG. 5 is a sectional view of metallic plates and connectors of a chassis base of a plasma display apparatus according to still another embodiment of the present invention.

With reference now to FIG. 5, a pair of metallic plates 331, 332, similar to the metallic plates described above, are shown combined with an electrically insulating connector 340 as part of a chassis base 330. Recesses 335 extend along sides of the metallic plates 331, 332 facing the connector 340. An edge of the connector 340 is inserted into each recess 335 to connect the metallic plates 331, 332 with the connector 340.

Figure 6:
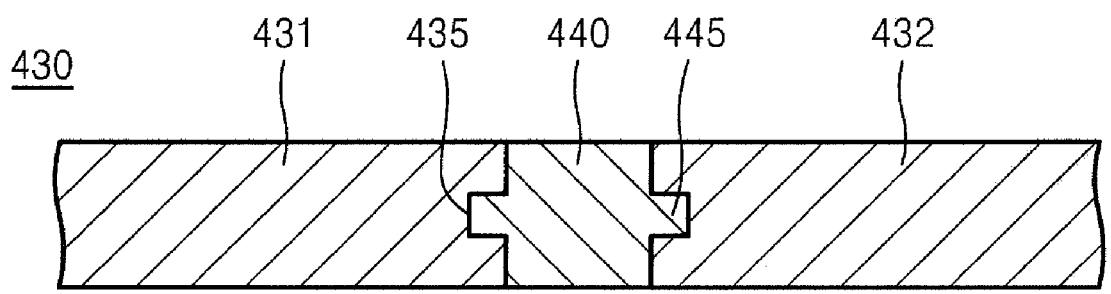
FIG. 6 is a sectional view of metallic plates and connectors of a chassis base of a plasma display apparatus according to yet another embodiment of the present invention.

With reference to FIG. 6, a chassis base 430 includes metallic plates 431, 432 connected by an electrically insulating connector 440. Recesses 435 extend along edges of the metallic plates 431, 432 facing the connector 440 and correspond to protrusions or ribs 445 extending along edges of the connector 440. The ribs 445 of the connector 440 are combined with the recesses 435 of the plates 431, 432 to securely connect the connector 440 and the metallic plates 431, 432.

Figure 7:
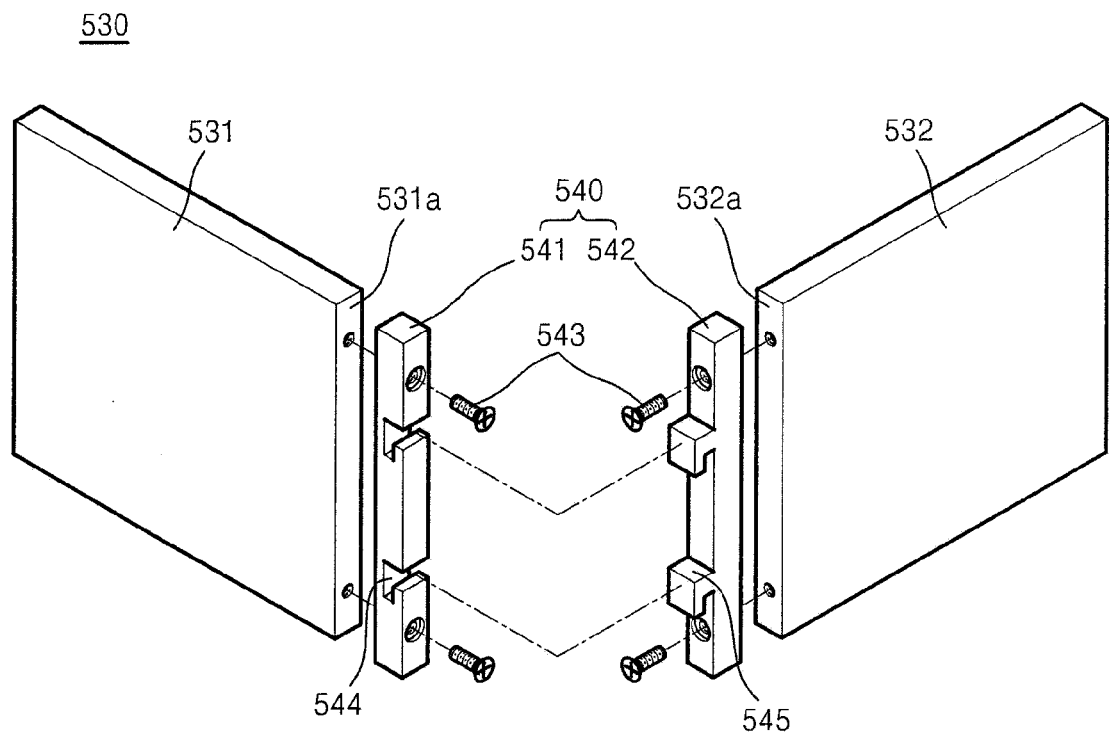
FIG. 7 is an exploded perspective view of metallic plates and connectors of a chassis base of a plasma display apparatus according to still another embodiment of the present invention.
Figure 8:
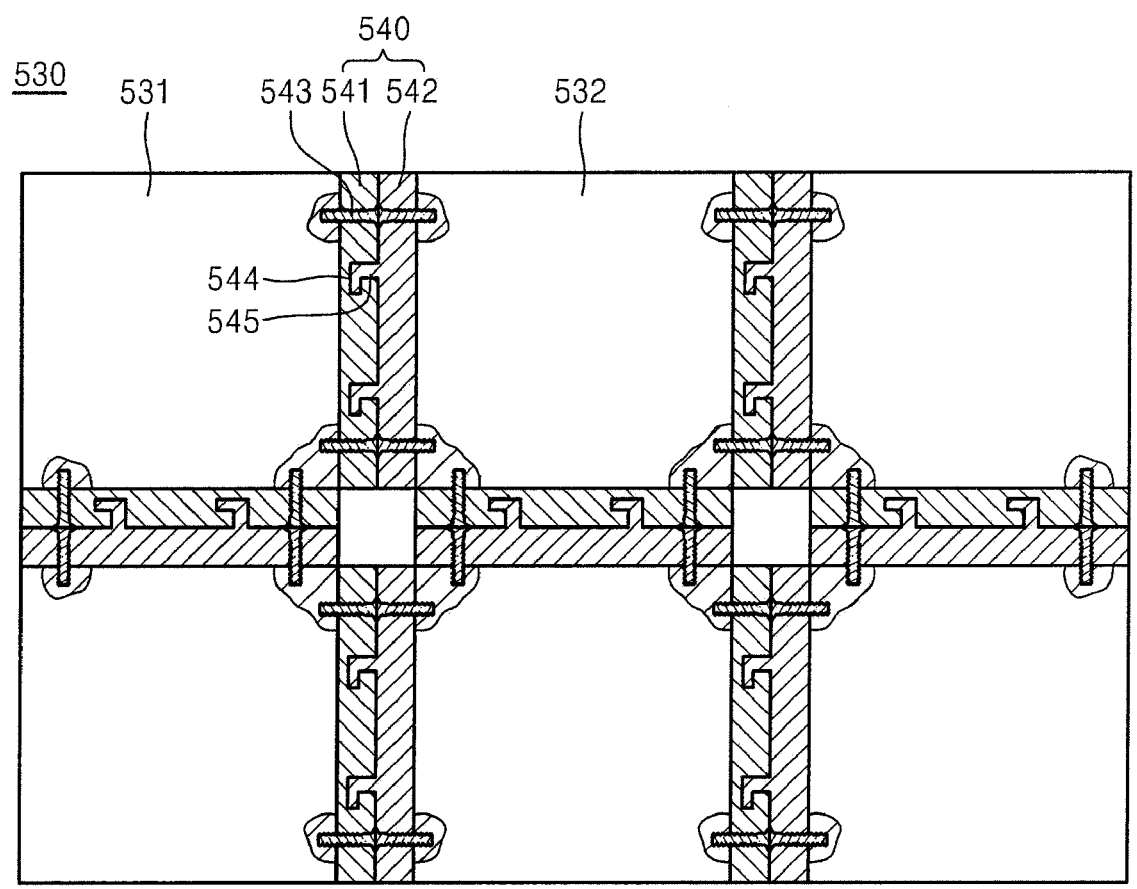
FIG. 8 is a plan view of metallic plates and connectors of the chassis base of FIG. 7.

With reference now to FIGS. 7 and 8, a chassis base 530 includes a plurality of metallic plates 531, 532 on a common plane, and an electrically insulating connector 540 connecting edges of the metallic plates. The connector 540 includes a first connector 541 attached to one edge 531a of metallic plate 531 and a second connector 542 attached to an edge 532a of metallic plate 532, unlike in the above embodiments in which one connector connects two metallic plates. The first and second connectors 541, 542 may be attached to the metallic plates 531, 532, respectively by a bolt 543, a screw, adhesive, or any other suitable fastener. Additionally, the first and second connectors 541, 542 and the first and second metallic plates 531, 532 may be connected by recesses and protrusions, as described above with respect to FIGS. 2-6.

The first connector 541 includes recesses 544, and the second connector 542 includes protrusions or hooks 545 having a shape corresponding to a shape of the recesses 544. The recesses 544 and the hooks 545 may be engaged to securely combine the first connector 541 to the second connector 542, and thereby connect the first and second metallic plates 531, 532.

Figure 9:
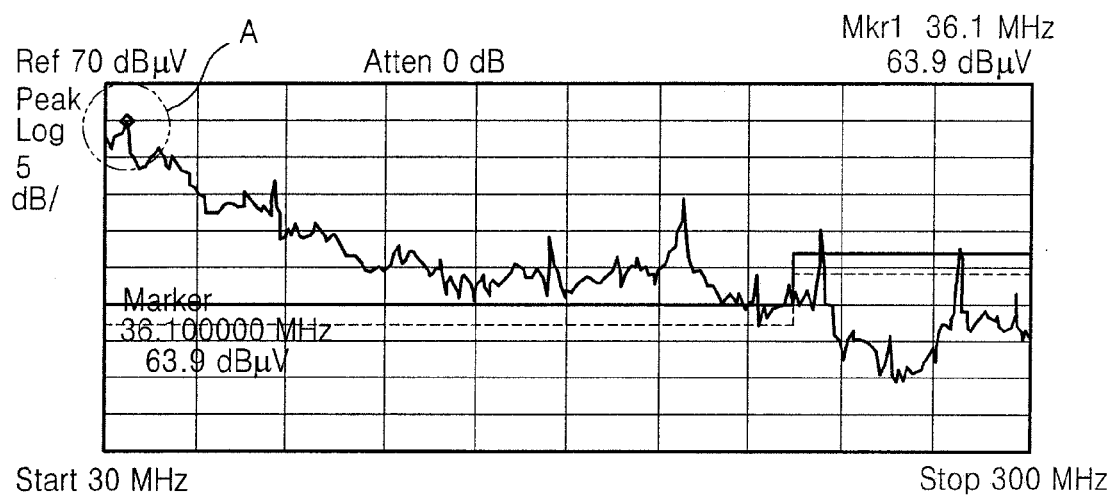
FIG. 9 is a chart illustrating noise measured in a conventional plasma display apparatus.
Figure 10:
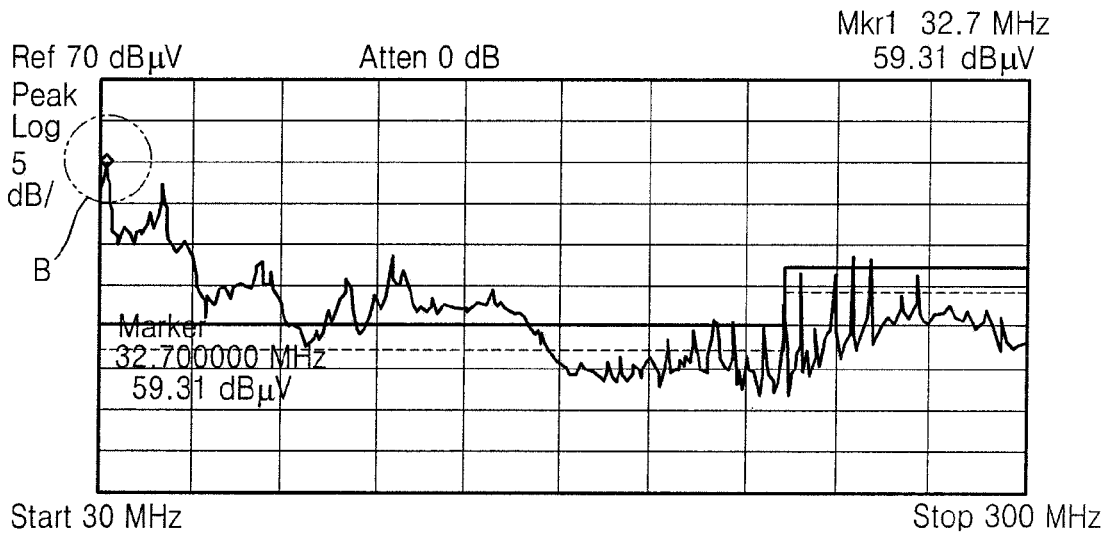
FIG. 10 is a chart illustrating noise measured in a plasma display apparatus according to an embodiment of the present invention as shown in FIG. 1.

FIG. 9 is a chart illustrating noise measured in a conventional plasma display apparatus, and FIG. 10 is a chart illustrating noise measured in a plasma display apparatus according to the embodiment of the present invention as shown in FIGS. 1 and 2.

Referring to FIG. 9, the width and length of the chassis base are 1,155 mm and 671 mm, respectively. As shown in FIG. 9, noise has a maximum value of 63.9 dB in portion A at a frequency of 36.1 MHz.

FIG. 10 shows noise measured in a plasma display apparatus having a chassis base divided into a plurality of metallic plates electrically insulated by a connector, according to an embodiment of the present invention as shown in FIGS. 1 and 2. The width and length of the metallic plates are 385 mm and 223 mm, respectively. As shown in FIG. 10, noise has a maximum value of 59.31 dB in portion B at a frequency of 32.7 MHz. Thus, the maximum electromagnetic radiation is reduced due to the improved structure of the chassis base that does not function as an antenna.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:
1. A display apparatus comprising:
  a display panel; and
  a chassis base for supporting the display panel, the chassis base comprising a plurality of metallic plates on a common plane and an electrically insulating connector between edges of a pair of adjacent metallic plates.

2. The display apparatus of claim 1, wherein a width and a length of each of the plurality of metallic plates is less than ¼ of a wavelength λ of a bandwidth of a maximum electromagnetic field in the display apparatus.

3. The display apparatus of claim 2, wherein the wavelength λ is obtained by the following equation $$\lambda = \frac{C}{f\sqrt{\epsilon\mu}}$$

where C is the light velocity, ϵ is the permittivity of a medium, μ is the permeability of the medium, and f is the frequency of a bandwidth of a maximum electromagnetic field.

4. The display apparatus of claim 1, wherein the electrically insulating connector comprises a first side and a second side opposite the first side each having a recess adapted to receive a metallic plate, wherein an edge of one of the plurality of metallic plates is in the recess on the first side and an edge of another of the plurality of metallic plates is in the recess on the second side.

5. The display apparatus of claim 4, wherein each of the plurality of metallic plates comprises a rib extending along at least one edge, the rib being within the recess of one of the first side and the second side of one electrically insulating connector.

6. The display apparatus of claim 1, wherein at least one edge of each of the plurality of metallic plates has a recess adapted to receive a side of one electrically insulating connector, one side of one electrically insulating connector being inserted into the recess.

7. A display apparatus comprising:
a display panel; and
a chassis base for supporting the display panel, the chassis base comprising a plurality of metallic plates on a common plane and an electrically insulating connector between edges of a pair of adjacent metallic plates, wherein the electrically insulating connector comprises:
a first connector attached to an edge of one of the plurality of metallic plates; and
a second connector adapted to receive the first connector and attached to an edge of another of the plurality of metallic plates, the second connector connected to the first connector.

8. The display apparatus of claim 7, wherein the first connector includes a recess, and the second connector has a protrusion adapted to fit within the recess such that when the protrusion is within the recess, the first connector is connected to the second connector.

9. The display apparatus of claim 7, wherein the first connector and the second connector are attached to the one metallic plate and the other metallic plate, respectively, by bolts.

10. The display apparatus of claim 7, wherein the first connector and the second connector each have a recess adapted to receive an edge of one of the plurality of metallic plates, wherein an edge of one metallic plate is within the recess on the first connector and an edge of another metallic plate is within the recess on the second connector.

11. The display apparatus of claim 1, wherein the display panel is a plasma display panel.

\* \* \* \* \*

UNITED STATES PATENT AND TRADEMARK OFFICE
CERTIFICATE OF CORRECTION

| | | |
|---|---|---|
| PATENT NO. | : 8,040,679 B2 | Page 1 of 1 |
| APPLICATION NO. | : 12/184034 | |
| DATED | : October 18, 2011 | |
| INVENTOR(S) | : Jae-Young Yeo | |

It is certified that error appears in the above-identified patent and that said Letters Patent is hereby corrected as shown below:

In the Claims

Column 7, Claim 3, line 12.      Delete "c"

Insert -- ε --

Signed and Sealed this
Sixteenth Day of October, 2012

David J. Kappos
*Director of the United States Patent and Trademark Office*